United States Patent [19]
Wei et al.

[11] Patent Number: 5,340,758
[45] Date of Patent: * Aug. 23, 1994

[54] DEVICE SELF-ALIGNMENT BY PROPAGATION OF A REFERENCE STRUCTURE'S TOPOGRAPHY

[75] Inventors: Ching-Yeu Wei; George E. Possin; Robert F. Kwasnick, all of Schenectady, N.Y.

[73] Assignee: General Electric Company, Schenectady, N.Y.

[*] Notice: The portion of the term of this patent subsequent to Oct. 20, 2009 has been disclaimed.

[21] Appl. No.: 938,562

[22] Filed: Aug. 28, 1992

Related U.S. Application Data

[63] Continuation of Ser. No. 593,425, Oct. 5, 1990, abandoned.

[51] Int. Cl.⁵ .................. H01L 21/336; H01L 21/28
[52] U.S. Cl. .......................... 437/40; 437/44; 437/101
[58] Field of Search ............ 437/40, 41, 101, 228, 437/52, 53

[56] References Cited

U.S. PATENT DOCUMENTS

| | | | |
|---|---|---|---|
| 4,633,284 | 12/1986 | Hansell et al. | 357/23.7 |
| 4,686,553 | 8/1987 | Possin | 357/23.7 |
| 4,715,930 | 12/1987 | Diem | 437/101 |
| 4,778,773 | 10/1988 | Sukegawa | 357/23.7 |
| 4,862,234 | 8/1989 | Koden | 357/23.7 |
| 5,010,027 | 4/1991 | Possin et al. | 437/101 |
| 5,028,551 | 7/1991 | Dohjo et al. | 437/41 |
| 5,032,883 | 7/1991 | Wakai et al. | 357/23.7 |
| 5,156,986 | 10/1992 | Wei et al. | 437/40 |

FOREIGN PATENT DOCUMENTS

| | | | |
|---|---|---|---|
| 0209862 | 9/1987 | Japan | 357/23.7 |
| 0246873 | 10/1988 | Japan | 357/23.7 |
| 0308384 | 12/1988 | Japan | 357/23.7 |

OTHER PUBLICATIONS

Norbert Marschall, "thin–Film Silicon Transistors for Driving Liquid–Crystal Displays," Technische Rundschau 50/86, pp. 76–81.

Kim et al., "Amorphous Silicon Thin–Film Transistors With Two–Layer Gate Insulator," Appl. Phys. Lett. 54(21), May 1989, pp. 2079–2081.

T. Kodama et al., "A self-Alignment Process for Amorphous Silicon Thin Films Transistors", IEEE Electron Device Letters, vol. EDL-3, Jul. 1982, pp. 187–189.

*Primary Examiner*—Mary Wilczewski
*Attorney, Agent, or Firm*—Donald S. Ingraham; Marvin Snyder

[57] ABSTRACT

A self-aligned, inverted, thin film field effect transistor is produced by patterning the gate electrode to have tapered edges followed by conformal deposition of subsequent layers of the device structure up through a support layer followed by deposition of a subordinate layer such as the source/drain metallization) on the support layer. The subordinate layer itself may be a planarization or non-conformal layer or may have a subsequent non-conformal planarization layer disposed thereon. Thereafter, the structure is non-selectively etched (preferably reactive ion etched) until the support layer is exposed by the creation of an aperture in the subordinate layer in alignment with raised portions of the reference layer while leaving the subordinate layer present on other parts of the structure. Thereafter, the remainder of the device is fabricated with the source and drain electrodes self-aligned with respect to the gate conductor using a selective etch method.

13 Claims, 14 Drawing Sheets

DEVICE SELF-ALIGNMENT BY PROPAGATION OF A REFERENCE STRUCTURE'S TOPOGRAPHY

This application is a continuation of application Ser. No. 07/593,425, filed Oct. 5, 1990, now abandoned.

RELATED APPLICATIONS

The present application is related to application Ser. No. 07/593,419, filed Oct. 5, 1990, entitled, "Thin Film Transistor Structure With Improved Source/Drain Contacts", by R. F. Kwasnick, et al.; application Ser. No. 07/593,423, filed Oct. 5, 1990, now abandoned, and refiled as a divisional application Ser. No. 07/667,149, filed Mar. 11, 1991, entitled, "Positive Control of the Source/Drain-Gate Overlap in Self-Aligned TFTs Via a Top Hat Gate Electrode Configuration", by C-Y Wei, et al.; application Ser. No. 07/593,421, filed Oct. 5, 1990, entitled, "Thin Film Transistor Having an Improved Gate Structure and Gate Coverage by the Gate Dielectric", application Ser. No. 07/510,767, filed Apr. 17, 1990, entitled "Method for Photolithographically Forming a Self-Aligned Mask Using Back Side Exposure and a Non-Specular Reflecting Layer", by G. E. Possin, et al.; and application Ser. No. 07/499,733, filed Mar. 21, 1990, entitled "Method for Fabricating a Self-Aligned Thin-Film Transistor Utilizing Planarization and Back-Side Photoresist Exposure", by G. E. Possin, et al., filed Mar. 21, 1990, each of which is incorporated herein by reference.

BACKGROUND OF THE INVENTION

1. Field of the Invention

The present invention relates to the field of fabrication techniques for thin film transistors, and more particularly to techniques for self-aligned fabrication of thin film transistors.

2. Background Information

Thin film transistors (TFTs) are employed in liquid crystal displays and imagers to control or sense the state of each pixel of the display or image. At present, such thin film transistors are typically fabricated from amorphous silicon. In such display or sensor systems, system operating characteristics are optimized by making each cell or pixel have substantially identical operating characteristics. These operating characteristics include switching speed, capacitive loading of drive and sense lines, the gain of transistors and so forth.

One of the processing problems which causes variation in the characteristics of different cells within such structures is the inability to accurately align the position of a mask which defines the source and drain electrodes of thin film transistors in a manner which ensures that the source/drain electrodes are accurately aligned with respect to the gate electrodes. Misalignment results in an increase in the overlap between the gate electrode and either the source electrode or the drain electrode with a corresponding decrease in the overlap between the gate and the other of them. Since the capacitances between the gate electrode and the source or drain electrodes are direct functions of the overlap between them, such a change in overlap produces a change in device's capacitances and consequently, switching speed and loading of other circuits. The possibility of misalignment requires that the size of the gate metal be increased to ensure that all devices have acceptable overlap between the gate and the source and drain. This increases the device size and hence the total capacitance per device. The device capacitance is important because it controls the charging time of the gate electrodes, the capacitive coupling between the gate and the source and drain nodes, and the noise introduced by the defects in the amorphous silicon or at the amorphous silicon/-dielectric interface. Consequently, there is a desire to provide self-alignment between the source and drain electrodes and the gate electrode in order to maintain a fixed, predictable overlap between the gate electrode and each of the source and drain electrodes across an entire wafer.

A variety of self-alignment techniques have been proposed or developed. The above-identified related applications Ser. Nos. 07/499,733 and 07/510,767 each disclose techniques for obtaining self-alignment between the gate electrode and the source and drain electrodes through the use of through-the-substrate exposure of photoresist. Such processes result in specific gate-to-source and gate-to-drain overlaps which are peculiar to those techniques and the particular manner in which they are carried out. Those overlaps may be smaller or larger than optimum. Such a through-the-substrate exposure technique is not suitable where the semiconductor itself or another device layer would absorb the light needed to expose the photoresist. Consequently, there is a need for other self-alignment techniques for thin film transistors.

OBJECTS OF THE INVENTION

Accordingly, a primary object of the present invention is to provide a new self-aligned fabrication technique for thin film transistors.

Another object of the present invention is to provide a self-aligned fabrication technique for a thin film transistor which does not rely on back-side, through the substrate photoresist exposure for that self-alignment.

Another object of the present invention is to provide a self-alignment method which is applicable to opaque substrates.

SUMMARY OF THE INVENTION

The above and other objects which will become apparent from the specification as a whole, including the drawings, are accomplished in accordance with the present invention by forming a patterned reference layer (gate metallization in a TFT) on a substrate with the reference layer preferably patterned to have vertically inwardly tapering sidewalls whereby it has a trapezoidal cross section with the trapezoid's narrow base further from the substrate than the trapezoid's wide base. Subsequent layers of the device structure are applied in a conformal manner up through a support layer. A subordinate layer (the source/drain metallization in a TFT) is formed on the support layer and may either be conformal or non-conformal. Where the subordinate layer is either conformal or not sufficiently non-conformal to provide a substantially planar surface for the structure, a planarization layer is applied after the subordinate layer. The planarization layer preferably has a substantially planar surface and thus, is itself non-uniform in thickness to compensate for the topology of the subordinate, support and lower layers. With the planarization layer on the structure, material is removed from the upper surface of the structure in a substantially uniform manner until the subordinate layer is exposed in alignment with raised portions of the reference layer. The exposed portion of the subordinate layer is then selectively etched to expose the support layer in alignment with the raised portion of reference layer. Alternatively, the planarization etch may be continued until the support layer is exposed in alignment with the raised portions of the reference layer. Thereafter, appropriate subsequent process steps are performed to complete the fabrication of the device. Those subsequent steps normally include patterning other portions of the subordinate layer to properly separate different elements of a device. In particular, in the fabrication of a field effect thin film transistor, the reference layer is preferably the gate electrode layer and the subordinate layer is preferably the source/drain metallization layer. That choice of reference and subordinate layers results in self-alignment of the source and drain electrodes with respect to the gate electrode with an overlap which is determined by the vertical taper on the gate metallization and the degree of conformity of the intervening layers to the gate electrode pattern.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

In accordance with one embodiment of the present invention, an amorphous silicon thin film field effect transistor may be fabricated. Various stages in the fabrication of such a device in accordance with the present invention are illustrated in FIGS. 1–13.

Figure 1:
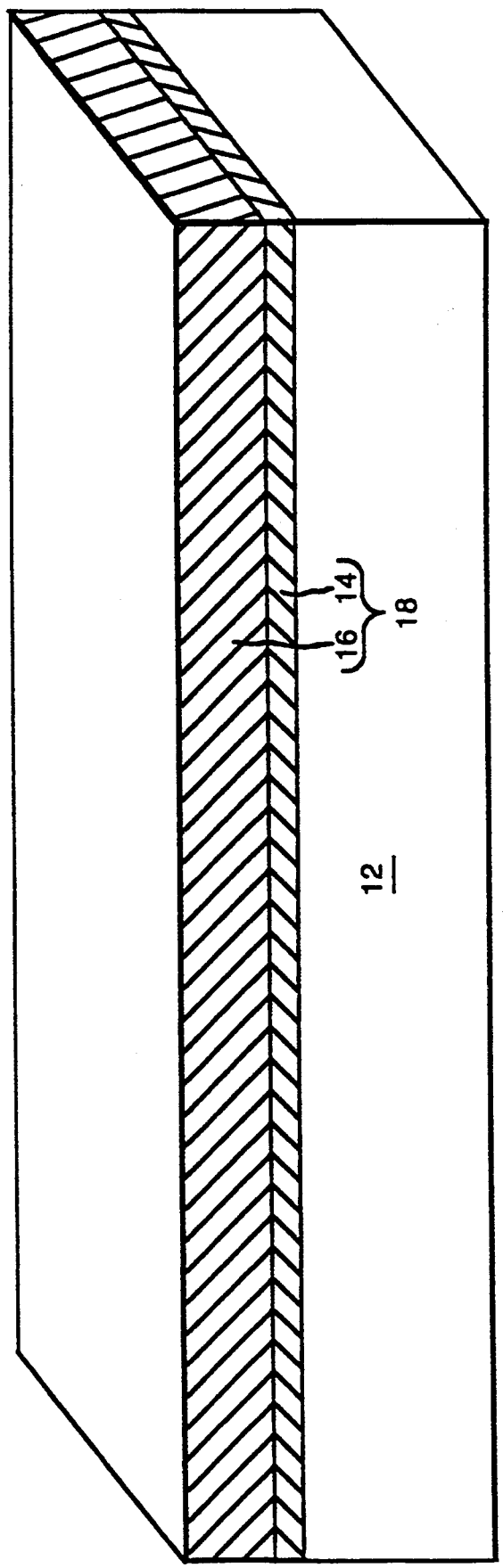
FIG. 1 is a perspective view, partially cross-section of a substrate having an unpatterned reference layer disposed thereon.

In FIG. 1, a substrate 12 has a uniform reference layer 18 disposed thereon. Reference layer 18 comprises first and second sublayers 14 and 16. For fabrication of a thin film transistor, the layer 18 constitutes the gate conductor while the substrate 12 constitutes a larger structure on which the transistor is to be disposed. In many applications such as liquid crystal displays and imagers, it is desirable that the substrate 12 be transparent, however, transparency of the substrate is unimportant to the present process and thus, is a matter of design choice in accordance with the intended use of the thin film transistor to be fabricated. Typical transparent substrate materials are glass, quartz and appropriate plastics.

The gate conductor sublayers 14 and 16 are deposited on the substrate in sequence by any appropriate technique such as sputtering, chemical vapor deposition, thermal evaporation and so forth. This gate conductor may be an individual metal such as titanium (Ti), chromium (Cr), tungsten (W), molybdenum (Mo), aluminum (Al) and so forth or may be comprised of dual metal layers such as a first layer of titanium disposed in contact with the substrate with a layer of molybdenum or aluminum (Mo/Ti or Al/Ti, respectively) disposed thereover or a layer of chromium disposed on a substrate with a layer of molybdenum disposed thereover (Mo/Cr). As a further alternative, the entire gate conductor 18 or either sublayer of it may be a transparent conductor material such as indium tin oxide or other transparent conductors. We prefer to use Mo/Cr in order to be able to incorporate the inventions of related applications Ser. No. 07/593,423, now abandoned and refiled as divisional Ser. No. 07/667,149, and 07/593,421 in the process and resulting structure.

The gate electrode is typically deposited to a thickness of 1,000 Å to 10,000 Å, depending on the sheet resistivity required for the gate electrode structure and the vertical height of the gate electrode required to achieve good self-alignment. With a Mo/Cr gate conductor, the Cr is preferably 100 to 500 Å thick and the Mo is preferably 1000 to 10,000 Å thick.

Figure 2:
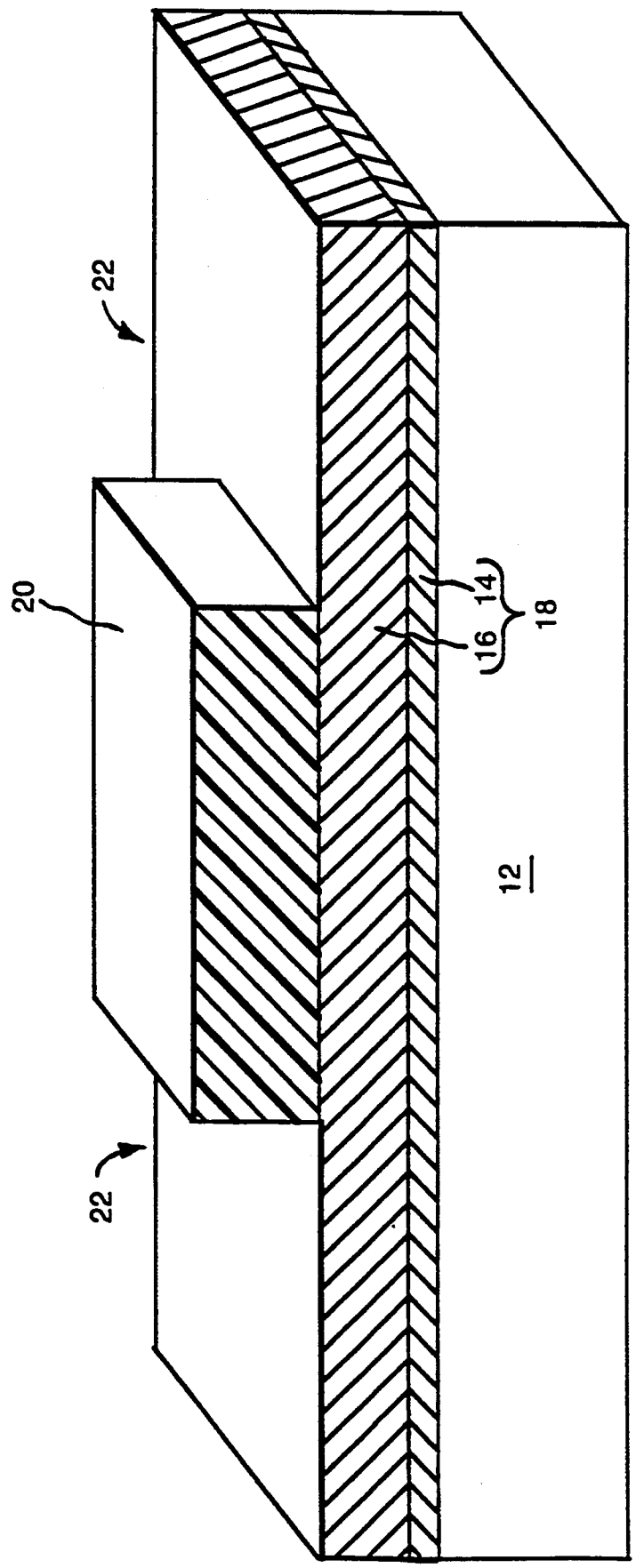
FIG. 2 is a perspective, partially cross-section view of the FIG. 1 structure having a patterned layer of photoresist disposed thereon.

The FIG. 1 structure is then photomasked to provide a mask pattern corresponding to the desired gate conductor configuration as shown in FIG. 2. The upper surface of the second conductor 16 is exposed in the window 22 where the photoresist 20 has not been retained. Next, the structure is dry etched preferably using reactive ion etching to pattern the upper conductor layer 16 in accordance with the retained photoresist pattern. To do this, the wafer is mounted in a reactive ion etching apparatus which is then purged and evacuated in accordance with normal reactive ion etching procedures. A source gas flow of preferably 37.5 sccm (standard cubic centimeters per minute) of sulphur hexafluoride ($SF_6$), 6.5 sccm of $Cl_2$ and 16 sccm of $O_2$ is established. The source gas flow is introduced into the etching chamber at a pressure of 65 mtorr and reactive ion etching potentials are applied to etch the molybdenum in the windows 22. This etching is preferably carried out until all the molybdenum is removed in center of the windows and is allowed to proceed for 40 seconds more of overetching to ensure that all of the molybdenum is removed from within the originally defined windows 22. This molybdenum etching step is preferably carried out at a power of 200 watts.

Figure 3:
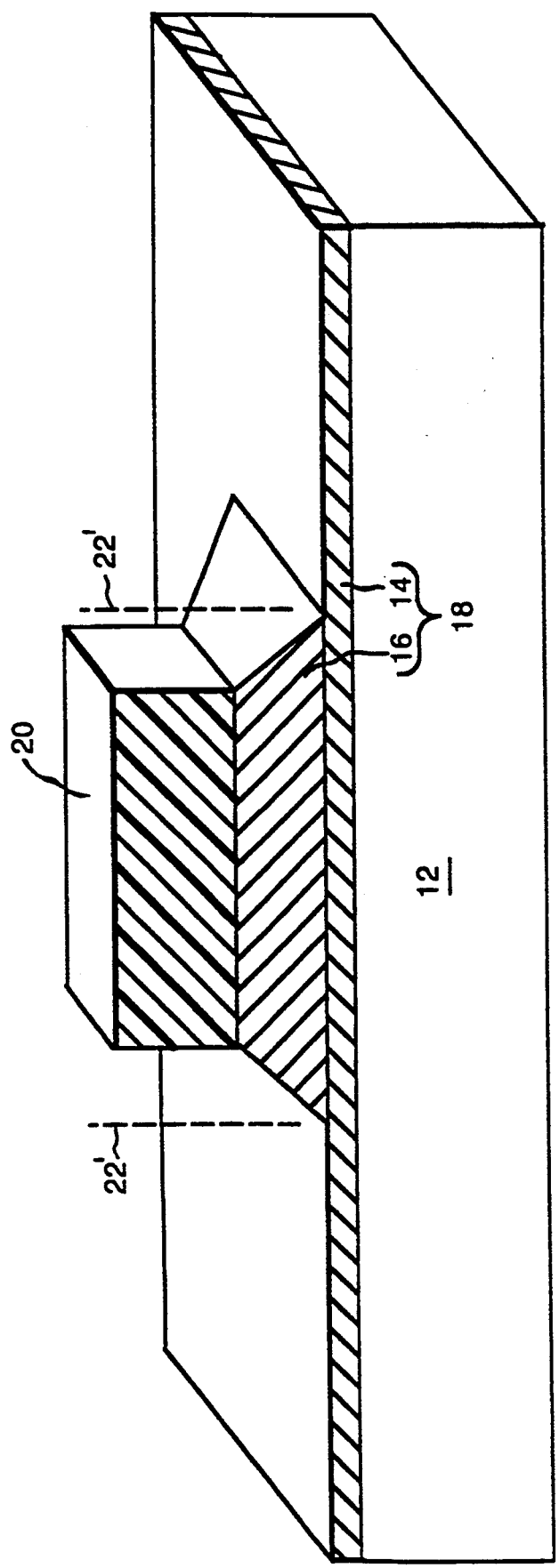
FIG. 3 is a perspective, partially cross-section view of the FIG. 2 structure following etching of an upper gate conductor layer.

Following this etching step, the structure appears as illustrated in FIG. 3. It will be noted, that the second conductor (molybdenum) has been removed from the structure everywhere outside the region which was initially protected by the retained portion of the photoresist 20. The original edges of the retained photoresist are indicated by the dash lines marked 22', but the photoresist has been etched back from that original edge as the etching of the molybdenum has proceeded. This results in the substantially 45° slope to the side walls of the molybdenum as illustrated in FIG. 3.

A tapered gate electrode of this type may be provided in a variety of other ways well known in the art including reliance on the erosion of the photoresist during etching of the gate conductor where reactive ion etching (RIE) is employed or an isotropic wet etch may be employed which undercuts the resist during etching of the unprotected portion of the gate conductor.

Such a slope is provided in RIE, in part because when the photoresist is baked after patterning to toughen it prior to RIE etching, the photoresist slumps with the result that its thickness tapers from small or zero at the edge of a photoresist region upward to the central thickness of the photoresist over a finite distance. During reactive ion etching, the photoresist erodes as the gate conductor is etched with the result that a taper is produced on the retained portion of the gate conductor.

Figure 4:
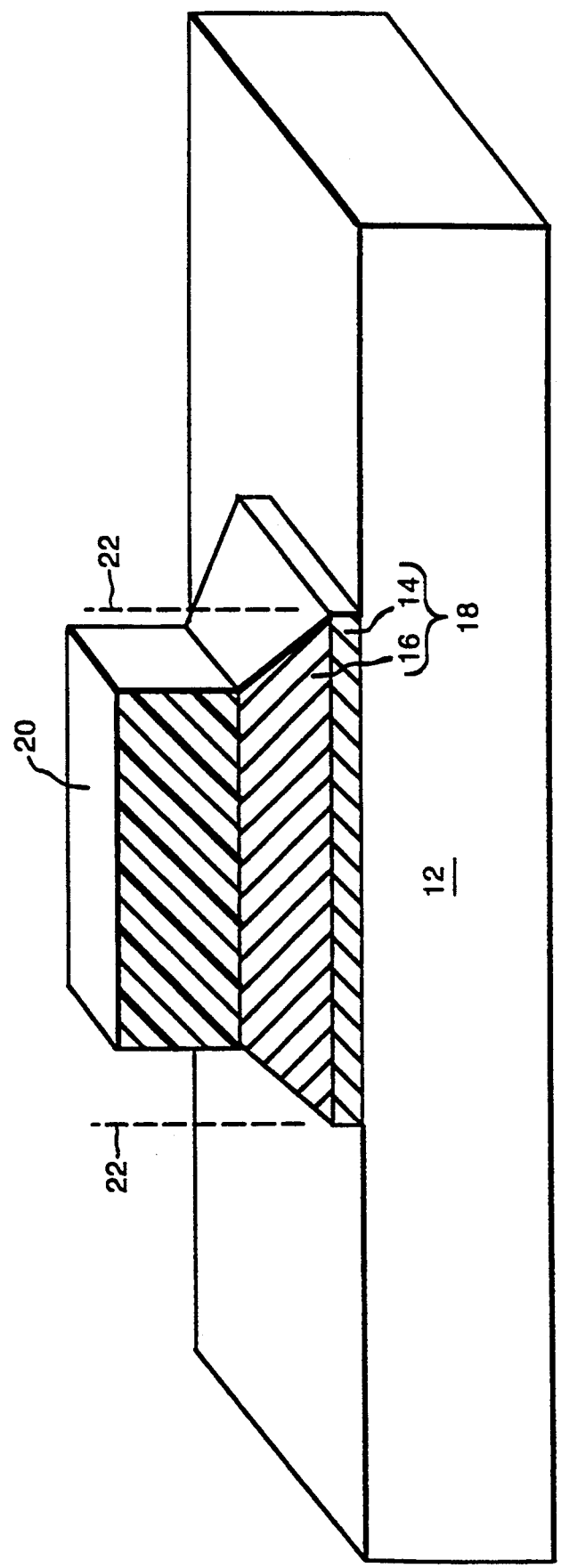
FIG. 4 is a perspective, partially cross-section view of the FIG. 3 structure following etching of a lower gate conductor layer.

Next, the etching gas is preferably changed to 70 sccm of $Cl_2$ and 30 sccm of $O_2$ at a pressure of 100 mtorr to remove the exposed chromium. This etch is preferably continued until all the exposed chromium appears to have been removed and is then continued for an additional 60 seconds to ensure complete removal of the exposed chromium. The degree of overetching which should be employed depends on the substrate composition and the relative etch rates of the first conductor 14 and the substrate in the etching composition employed. This etching step is preferably carried out at a power of 300 watts. Following this step, the structure appears as illustrated in FIG. 4.

Figure 5:
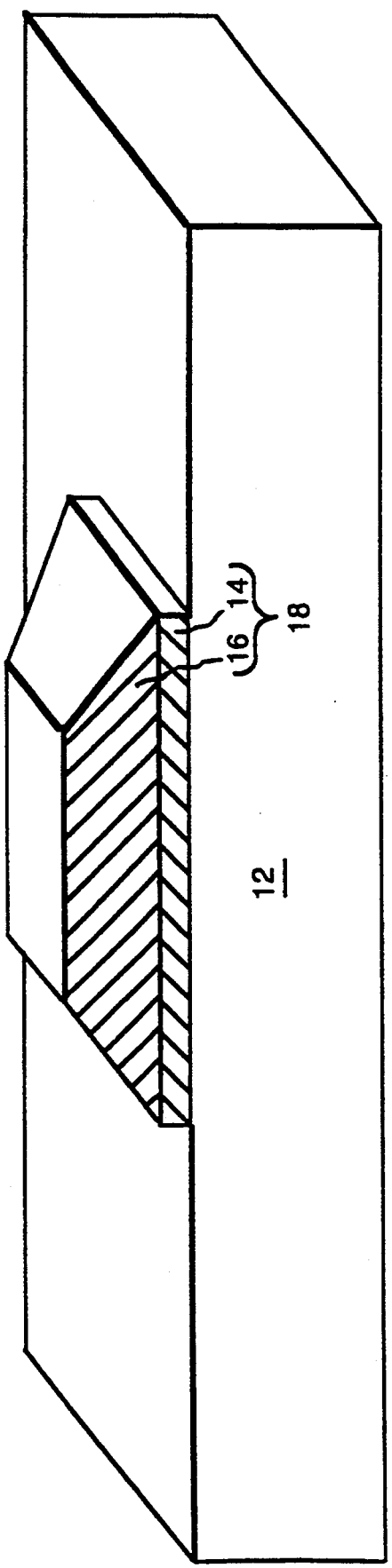
FIG. 5 is a perspective, partially cross-section view of the FIG. 4 structure following removal of the retained photoresist.

The remaining photoresist is then removed to leave the structure illustrated in FIG. 5.

Next, a gate dielectric layer 28 is deposited over the entire structure preferably by chemical vapor deposition or some other process which is known to produce a high integrity dielectric. This gate dielectric is preferably be silicon nitride but may be silicon dioxide or other dielectrics and is about 1000 to 4000Å thick. The chromium gate conductor layer 14 is sufficiently thin (10 to 1000Å) and the sidewall of the molybdenum gate conductor layer 16 is sufficiently vertically inwardly tapered or sloped that a high integrity conformal dielectric layer results.

Figure 6:
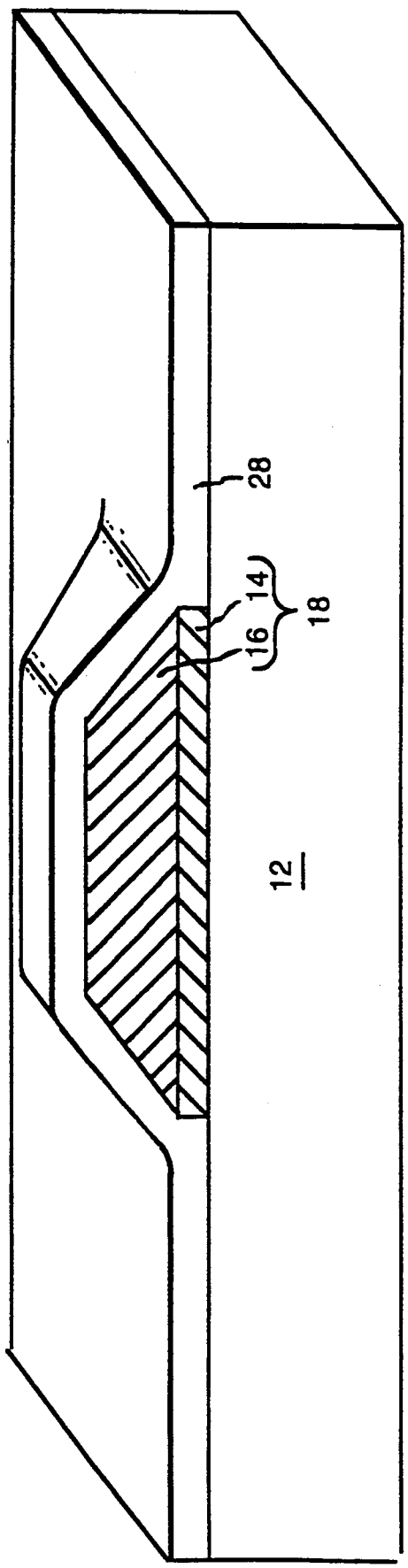
FIG. 6 is a perspective, partially cross-section view of the FIG. 5 structure following the deposition of a gate insulator thereover.
Figure 7:
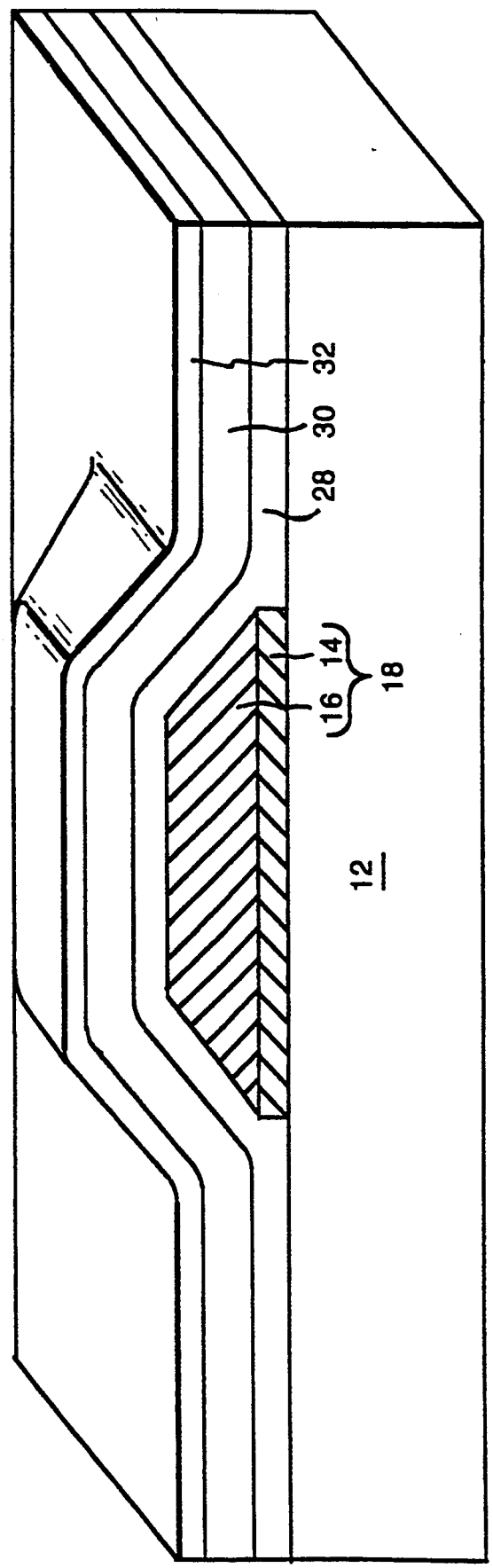
FIG. 7 is a perspective, partially cross-section view of the structure following the deposition of two layers of semiconductor material.

This deposition of gate dielectric on the upper surface of the structure is done in a conformal manner whereby the raised configuration of the patterned gate electrode extends to the upper surface of that gate dielectric layer, that is, the surface topography is essentially unchanged as shown in FIG. 6.

Thereafter, in the fabrication of a typical silicon thin film transistor, a layer 30 of intrinsic amorphous silicon is deposited on the gate dielectric layer in a conformal manner. This intrinsic amorphous silicon layer typically has a thickness on the order of 2,000 Å. A thinner layer 32 (about 500 Å) of doped (typically phosphorous doped or n+) amorphous silicon is then deposited on the intrinsic amorphous silicon in a conformal manner to provide the structure illustrated in FIG. 7.

The dielectric layer, the intrinsic amorphous silicon and the doped amorphous silicon may all be deposited in the same deposition chamber without breaking the vacuum. Where that is done, we prefer to stop the plasma discharge in the deposition chamber after the completion of the deposition of a particular layer until after the proper gas composition for the deposition the next layer has been established. We then re-establish the plasma discharge to deposit that new layer. Alternatively, the two silicon depositions may be done in different chambers.

Figure 8:
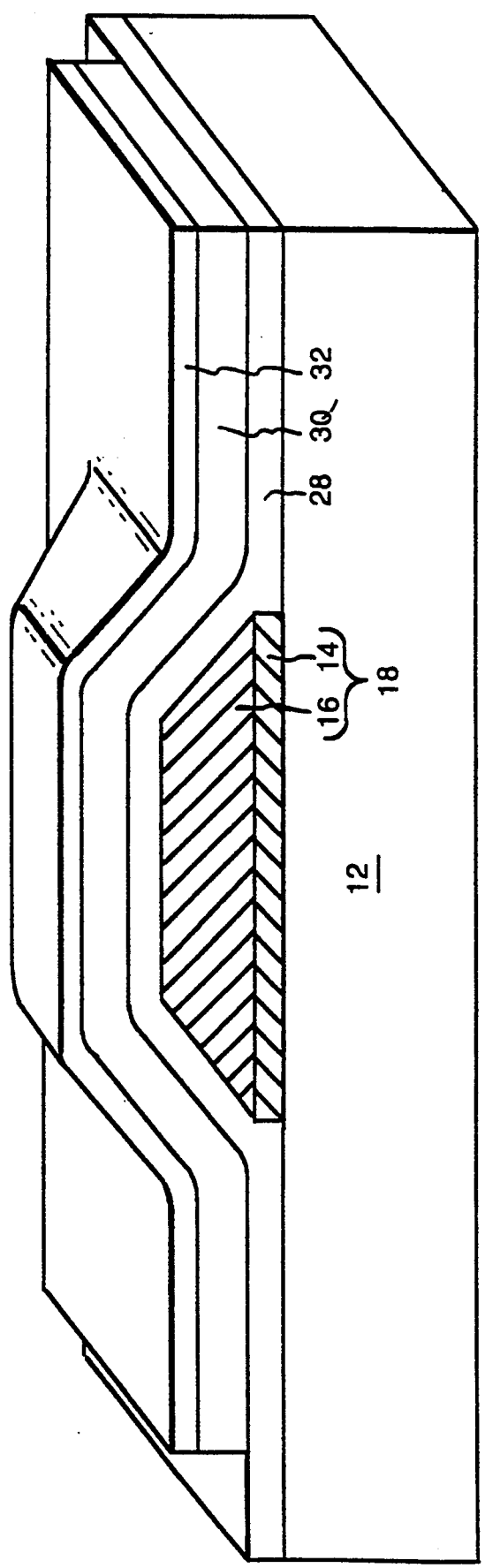
FIG. 8 is a perspective, partially cross-section view of the FIG. 7 structure after patterning of the layers of semiconductor material.

At this stage, the silicon layers may be patterned photolithographically to restrict them to the part of the structure where the silicon is needed, as shown in FIG. 8.

Figure 9:
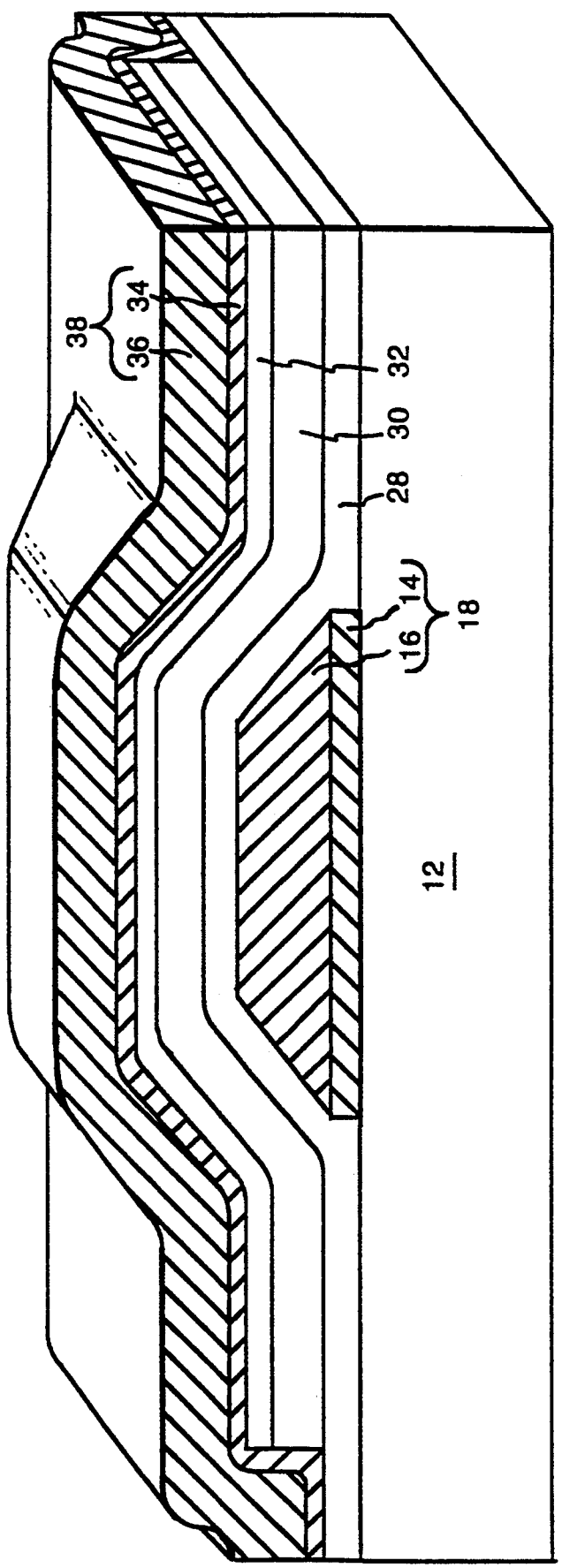
FIG. 9 is a perspective, partially cross-section view of the structure following the deposition of two layers of source/drain metallization.

Thereafter, the source/drain metallization is deposited over the structure in a conformal manner as illustrated in FIG. 9. In accordance with application Ser. No. 07/593,419 entitled, "Thin Film Transistor Structure With Improved Source/Drain Contacts", this source/drain metallization 38 is preferably a two layer molybdenum 36 on chromium 34 (Mo/Cr) metallization in which the Cr is 100 to 1000 Å thick and the molybdenum is 1000 to 10,000 Å thick, as shown in FIG. 9. Alternatively, this metallization may be a single metal alone such as molybdenum chromium or tungsten.

Figure 10:
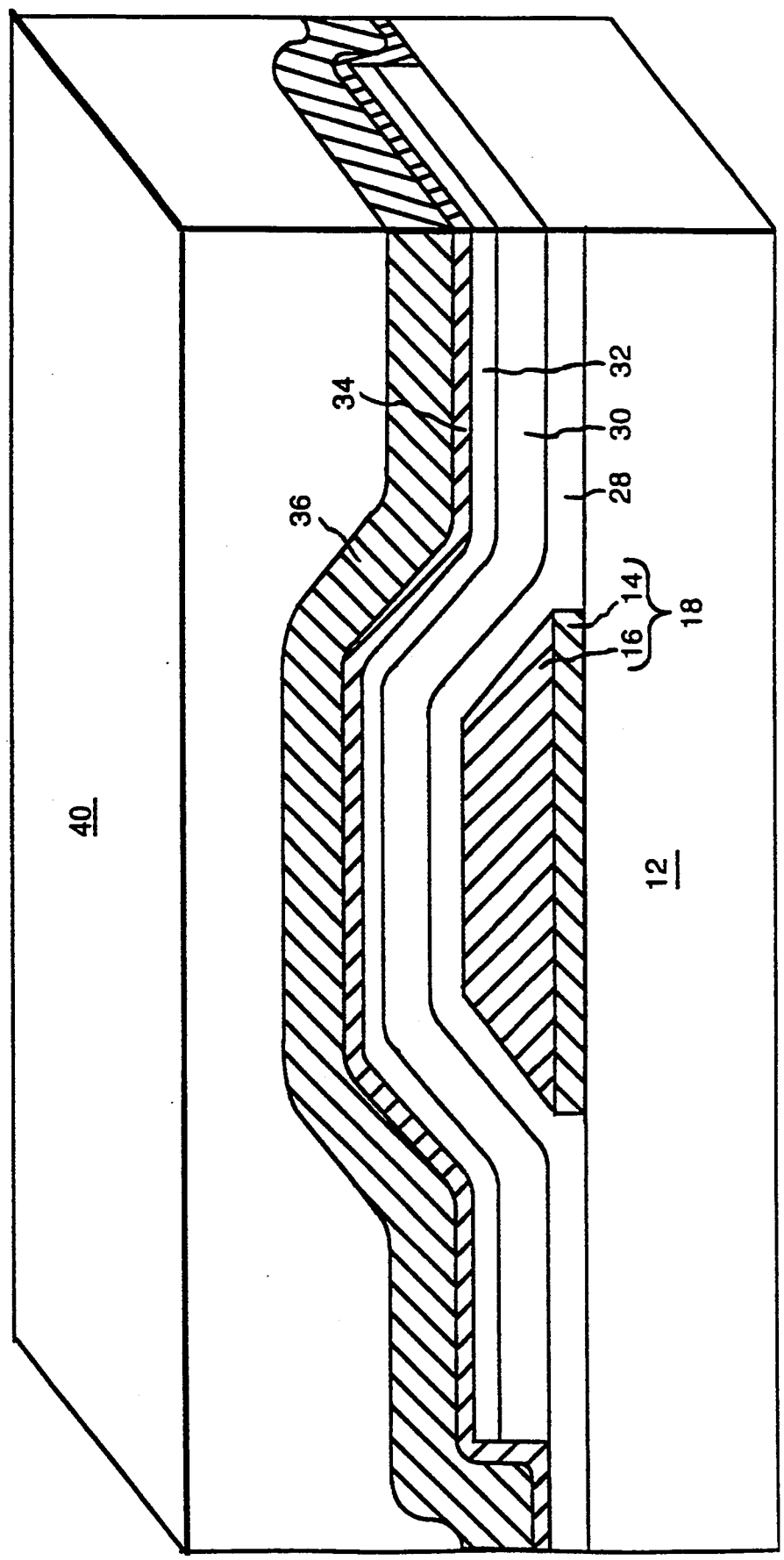
FIG. 10 is a perspective, partially cross-section view of the structure following completion of the structure through the formation of a planar surface.

A planarization layer 40 (which may be photoresist) is then formed over the entire structure to provide a substantially planar upper surface 42 of the structure as shown in FIG. 10.

In this manner, the topology of the patterned gate conductor is propagated upward through the various layers, at least through the support layer (the n+doped amorphous silicon in this example) on which the source/drain metallization is disposed. That propagation of topography could be terminated by the source/drain metallization itself, but is at this time preferably terminated by a separate planarization layer because common metallization deposition processes are substantially conformal in nature and making the source/drain metallization conformal enables the final source and drain electrodes to be thicker.

Figure 11:
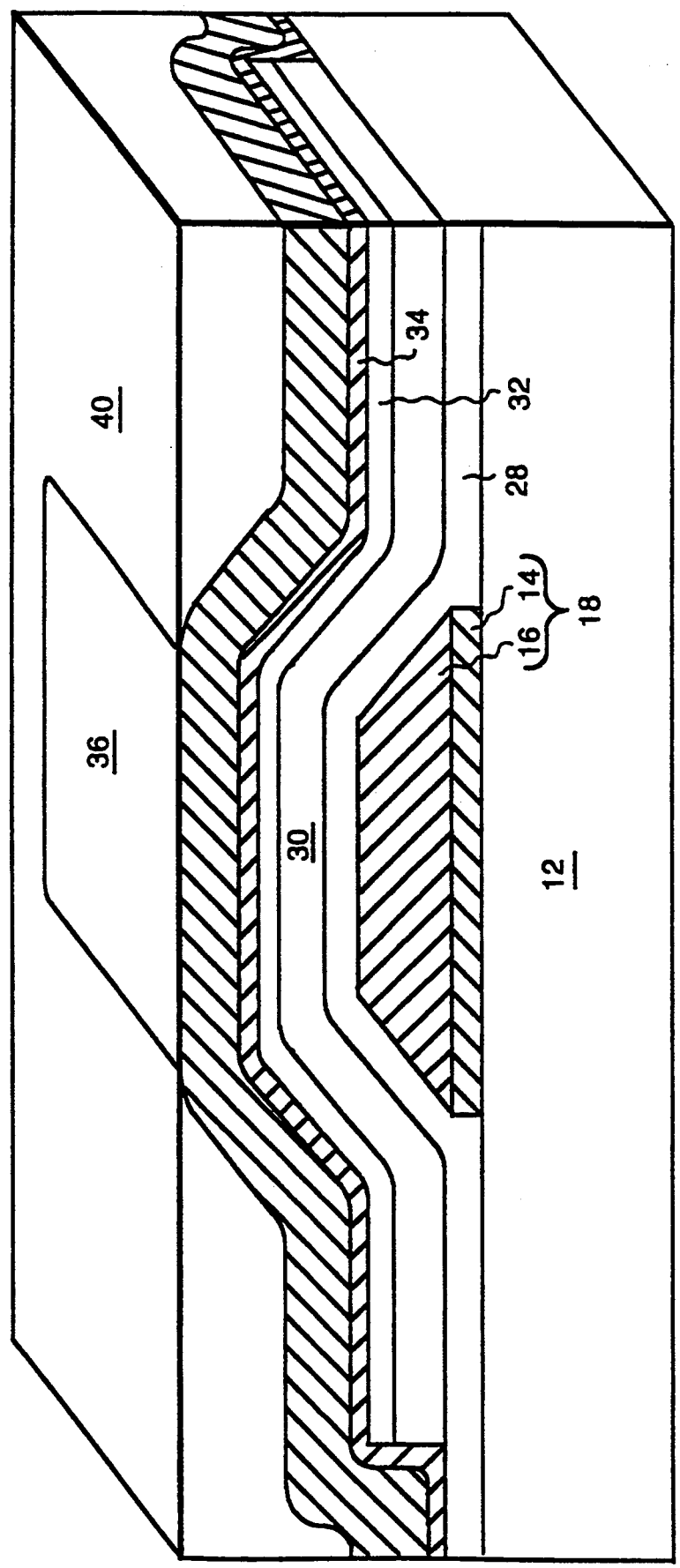
FIG. 11 is a perspective, partially cross-section view of the structure following uniform removal of enough material from the structure to expose the support layer within an aperture in the subordinate layer.

The entire structure is then etched back in a non-selective manner by a planarization reactive ion etch. This planarization etch is preferably stopped once the molybdenum over the gate electrode has been exposed. That exposed molybdenum is then selectively etched with the remaining portion of the planarization layer serving as the etching mask to restrict that etching to the molybdenum which is over the gate electrode. This is followed by etching the now exposed chromium. As illustrated in FIG. 11, the substantially non-selective etch of the planarization material ultimately uncovers an area of the underlying layer that is disposed above the top raised portion of the gate topography and produces an exposed portion 36 which has a self-aligned overlap between the source and drain electrodes and the gate electrode. Alternatively, the planarization etch may be continued until the chromium layer of the source/drain metallization has been exposed. That exposed chromium 34 is then selectively etched to expose the doped silicon 32. As a still further alternative, the planarization etch can be continued until the doped silicon becomes exposed, or still further until the substantially undoped silicon is exposed.

At this stage, any remaining exposed doped silicon is removed by etching to leave only intrinsic silicon between the source and drain electrodes. This normally involves the removal of some, but not all of the intrinsic amorphous silicon in order to ensure that all of the doped amorphous silicon has been removed.

Figure 12:
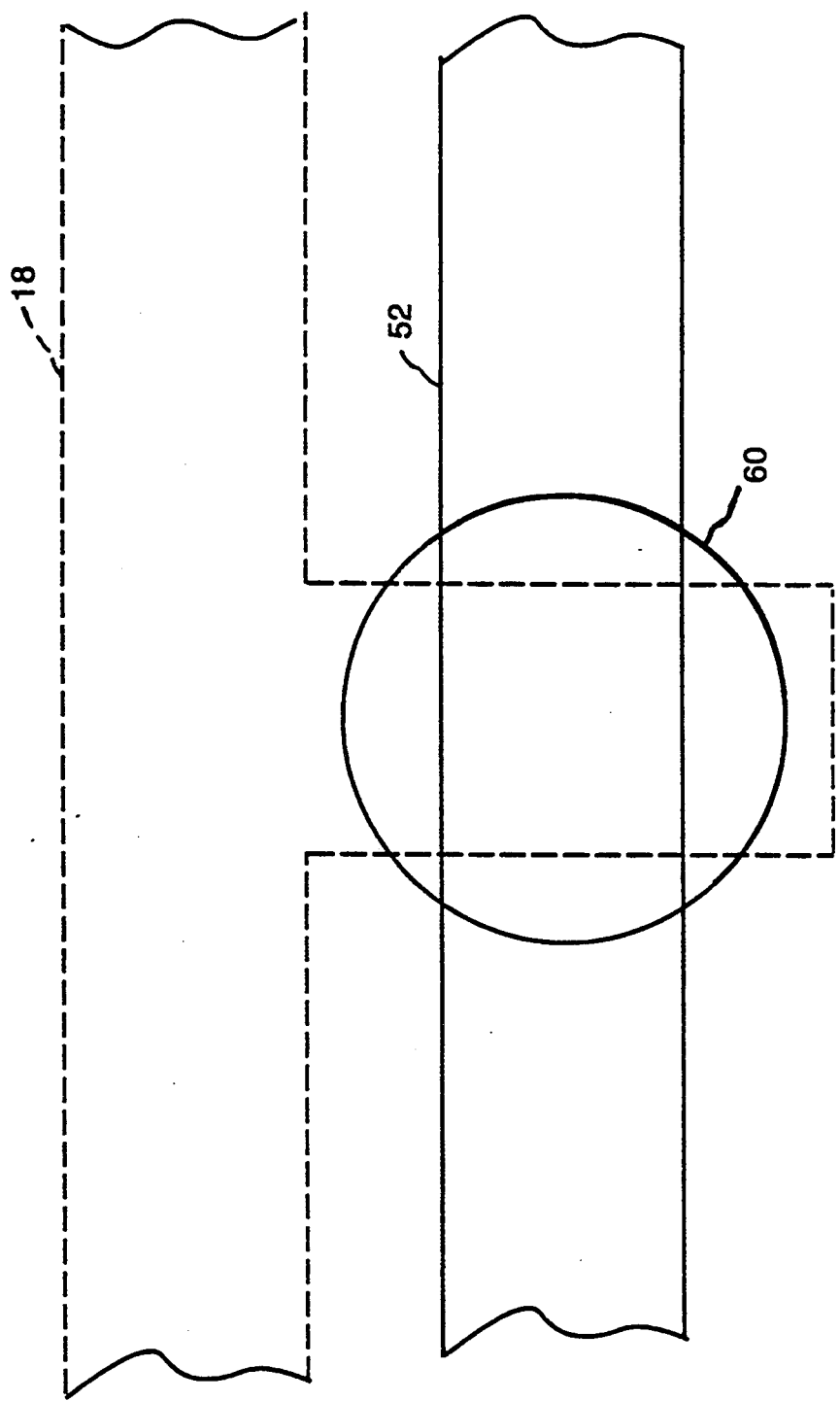
FIG. 12 is a plan view of a portion of the structure.
Figure 13:
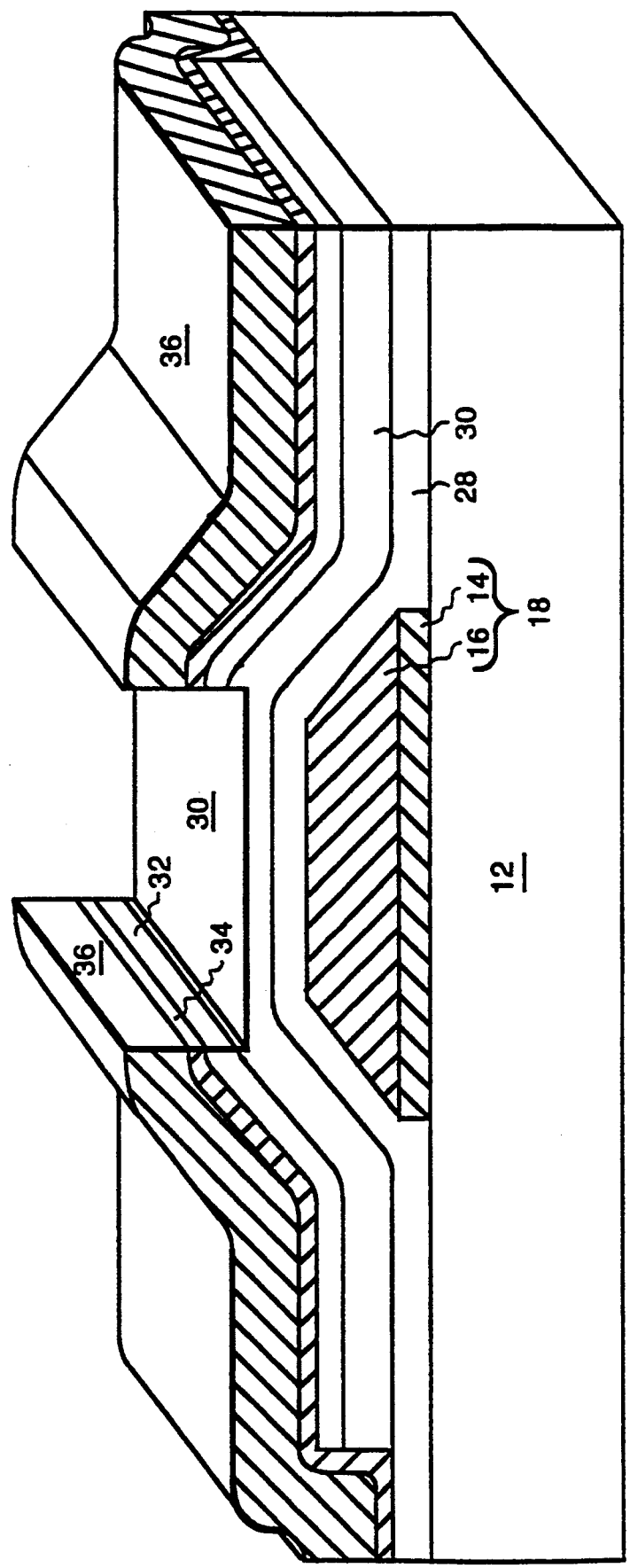
FIG. 13 is a perspective, partially cross-section view of the FIG. 11 structure following patterning of the subordinate layer edges away from the self-aligned portion of the structure including the side regions not covered by metal.

A key consideration is that the source/drain gap in the circle 60 in the top down view in FIG. 12 is disposed in proper alignment with the underlying gate electrode 18. Since the source/drain gap is defined by the self-aligned planarization method just described, control of the size of the source/drain gap and its location is independent of the alignment of the etching mask 52 which controls the pattern and location of the other portions of the boundary of the retained source/drain metallization.

If the silicon was not patterned previously it is usually necessary to remove excess silicon exposed after the removal of the source/drain metal. This etch is done with the source/drain mask still in place in order to protect the exposed silicon in the channel region.

The source and drain metallization is then patterned to provide the various desired segments of the source and drain metallization which connect to various devices and interconnect devices in a manner which is appropriate to the structure being fabricated. The etching of the pattern of the source/drain metallization may preferably be done in two stages using RIE with the appropriate source gases discussed above or it may be done by wet etching or other means. This yields the structure illustrated in FIG. 13.

Figure 14:
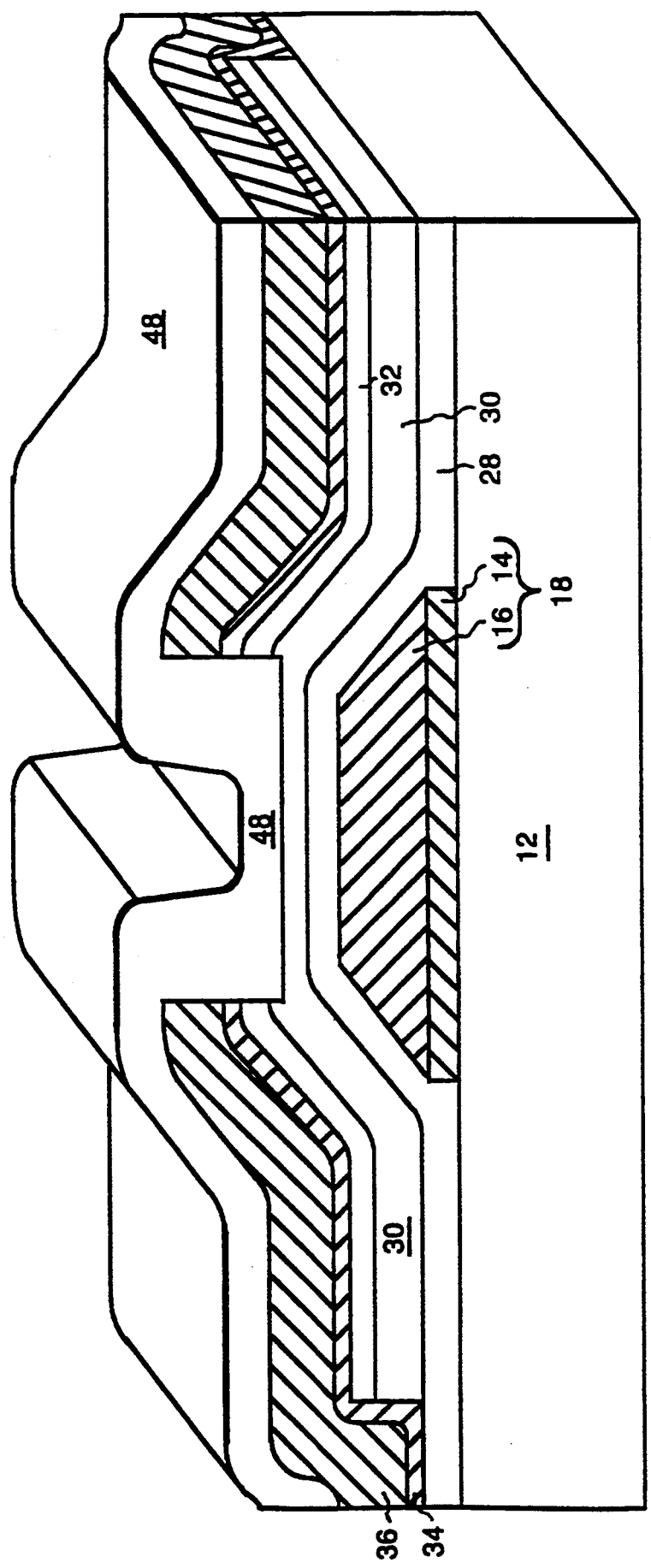
FIG. 14 is a perspective, partially cross-section view of the structure following formation of a passivation layer over the structure.

Thereafter, a passivation layer 48 may be deposited on the upper surface of the structure as shown in FIG. 14. This passivation layer is known as a back channel passivation layer since its purpose is to passivate the back or the away-from-the-gate-metallization surface of the silicon to maximize the stability of the device characteristics of this thin film transistor. This passivation layer is typically about 2,000 Å and may be silicon dioxide, silicon nitride, a polymer or other appropriate materials.

Typically, the illustrated thin film transistor is only one of many such thin film transistors which are simultaneously fabricated on the same substrate.

While the semiconductor material in the just described embodiment is amorphous silicon, since that is the material presently in typical use for thin film transistors, it should be understood that this process is equally applicable to the use of other semiconductor materials or other forms of silicon. Further, while the gate dielectric layer has been described as being silicon nitride, it will be understood that more than one sublayer may be present in the gate dielectric layer and various sublayers may have different compositions and a single layer dielectric may be SiO$_2$ or other dielectric materials.

Other semiconductor materials which are presently used in an amorphous condition are germanium and cadmium selenide. This process technique is applicable to those amorphous silicon semiconductor materials and any others as well as being applicable to polycrystalline or even monocrystalline semiconductor materials where the underlying support structure supports the formation of such semiconductor layers.

There are a number of other variations possible. The silicon could be left unpatterned. This results in intrinsic amorphous silicon and n+amorphous silicon being left under the source/drain metallization in all places. For applications such as imagers this is acceptable. Just the intrinsic amorphous silicon could be patterned before the n+amorphous silicon deposition and then the source/drain metallization deposited. This would result in n+under the source/drain metallization in all places. This could be acceptable even for displays where the contact to the transparent electrode would then be metal/n+/transparent electrode.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a thin film transistor in a self-aligned manner comprising the steps of:

forming a patterned gate conductor on an upper surface of a substrate, said patterned gate conductor having a selected topography defined by the thickness of said patterned gate conductor above said substrate upper surface and the vertical taper of sidewalls of said patterned gate conductor, said patterned gate conductor being narrower at a top raised portion that is remote from said upper surface of said substrate than it is adjacent to said upper surface of said substrate;

depositing a substantially conformal dielectric layer over said patterned gate conductor and exposed portions of said upper surface of said substrate;

depositing a substantially conformal layer of semiconductor material over said dielectric layer;

depositing a substantially conformal layer of source/drain metallization over said semiconductor material layer;

said selected topography being propagated upward through each of the substantially conformal dielectric material, semiconductor material, and source/drain metallization layers;

forming a planarization layer of a planarization material over the source/drain metallization, said planarization layer having a substantially planar exposed surface;

uniformly removing said planarization material until a portion of said source/drain metallization is exposed that is in substantial alignment with said top raised portion of said gate conductor;

selectively etching the exposed source/drain metallization to form source and drain electrodes self aligned to said patterned gate conductor and to expose the underlying semiconductor material, the self-aligned source and drain electrodes being formed without through-the-substrate exposure of photoresist to obtain the self-alignment.

2. The method recited in claim 1 further comprising the step of:

providing a back channel passivation layer over the structure.

3. The method recited in claim 1 wherein:

said semiconductor material layer comprises amorphous semiconductor material.

4. The method recited in claim 3 wherein the step of depositing the semiconductor material comprises:

first depositing a layer of substantially undoped amorphous semiconductor material; and second depositing a substantially conformal layer of doped amorphous semiconductor material over said layer of substantially undoped amorphous semiconductor material.

5. The method recited in claim 4 further comprising performing the following step prior to performing the step of depositing the source/drain metallization:
patterning said doped amorphous semiconductor material and said substantially undoped amorphous semiconductor material layers.

6. The method recited in claim 5 wherein:
said semiconductor material is silicon.

7. The method recited in claim 1 wherein the step of depositing the semiconductor material comprises:
first depositing a layer of substantially undoped amorphous semiconductor material; and
second depositing a substantially conformal layer of doped amorphous semiconductor material over said layer of substantially undoped amorphous semiconductor material.

8. The method recited in claim 7 wherein:
said semiconductor material is silicon.

9. The method recited in claim 1 wherein: said semiconductor material is silicon.

10. A method of fabricating a thin film transistor in a self-aligned manner comprising the steps of:
forming a gate conductor pattern on an upper surface of a substrate, said gate conductor pattern having a selected topography including substantially vertically tapered sidewalls and a top surface disposed between opposite ones of said sidewalls;
depositing a substantially conformal gate dielectric layer over said gate conductor pattern and exposed portions of said substrate surface;
depositing a substantially conformal layer of substantially undoped semiconductor material over said gate dielectric layer;
depositing a substantially conformal doped layer of semiconductor material over said substantially undoped layer of semiconductor material;
depositing a substantially conformal layer of source/drain metallization over said of source/drain metallization over said doped semiconductor material layer;
forming a planarization layer of a planarization material over the source/drain metallization, said planarization layer having a substantially planar exposed surface;
uniformly removing said planarization material until said source/drain metallization that is in substantial alignment with said gate conductor top surface is exposed;
selectively removing the exposed source/drain metallization to expose the underlying doped semiconductor material, such that self-aligned source and drain electrodes are formed without through-the-substrate exposure of photoresist to obtain the self-alignment;
removing the doped semiconductor material layer where it has been exposed by removal of said source/drain metallization.

11. The method recited in claim 10 further comprising the step of:
providing a back channel passivation layer over the structure.

12. The method recited in claim 10 further comprising performing the following step prior to performing the step of depositing the source/drain metallization:
patterning said doped semiconductor material and said substantially undoped amorphous silicon layers.

13. The method recited in claim 10 wherein:
said semiconductor material is silicon.

* * * * *